United States Patent
Yang

(10) Patent No.: US 10,305,428 B1
(45) Date of Patent: May 28, 2019

(54) PASSIVE MIXER

(71) Applicant: QUALCOMM Incorporated, San Diego, CA (US)

(72) Inventor: Bo Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/005,458

(22) Filed: Jun. 11, 2018

Related U.S. Application Data

(60) Provisional application No. 62/599,598, filed on Dec. 15, 2017.

(51) Int. Cl.
| | |
|---|---|
| *G06G 7/12* | (2006.01) |
| *H04B 1/10* | (2006.01) |
| *H03D 7/14* | (2006.01) |
| *H04B 1/38* | (2015.01) |

(52) U.S. Cl.
CPC ......... *H03D 7/1466* (2013.01); *H03D 7/1441* (2013.01); *H03D 2200/0074* (2013.01); *H03D 2200/0088* (2013.01); *H04B 1/38* (2013.01)

(58) Field of Classification Search
CPC ............... H03D 7/1466; H03D 7/1441; H03D 2200/0074; H04B 1/38
See application file for complete search history.

(56) References Cited

U.S. PATENT DOCUMENTS

| | | | |
|---|---|---|---|
| 7,599,675 B2 | 10/2009 | Mu et al. | |
| 8,138,817 B2* | 3/2012 | Brekelmans | ........... H03D 7/165 327/355 |
| 8,145,155 B2 | 3/2012 | Pullela et al. | |
| 8,331,897 B2 | 12/2012 | Kim et al. | |
| 9,071,197 B2 | 6/2015 | Vora et al. | |
| 2010/0166227 A1 | 7/2010 | Pennock | |
| 2017/0141805 A1* | 5/2017 | Kim | .................... H04L 27/2276 |

* cited by examiner

*Primary Examiner* — Kenneth B Wells
(74) *Attorney, Agent, or Firm* — Qualcomm Incorporated/Seyfarth Shaw LPP; Alan M. Lenkin

(57) ABSTRACT

A passive mixer may include an output coupled to a next stage circuit. The output may be coupled to baseband inputs via first switches. The passive mixer may further include a tunable capacitor bank. The tunable capacitor bank may be coupled via second switches to the baseband inputs.

21 Claims, 8 Drawing Sheets

| Phase of First Switches 510 | Phase of Second Switches 520 | Difference of Phases |
|---|---|---|
| [n-2]: 180 degrees | [n+2]: 180 degrees | 0 degrees |
| [n-1]: 270 degrees | [n+1]: 90 degrees | 180 degrees |
| [n]: 0 degrees | [n]: 0 degrees | 0 degrees |
| [n+1]: 90 degrees | [n-1]: 270 degrees | 180 degrees |

*FIG. 5B*

| Phase of First Switches 610 | Phase of Second Switches 620 | Difference of Phases |
|---|---|---|
| [n-3]: 225 degrees | [n+3]: 135 degrees | 90 degrees |
| [n-2]: 270 degrees | [n+2]: 90 degrees | 180 degrees |
| [n-1]: 315 degrees | [n+1]: 45 degrees | 270 degrees |
| [n]: 0 degrees | [n]: 0 degrees | 0 degrees |
| [n+1]: 45 degrees | [n-1]: 315 degrees | 270 degrees |
| [n+2]: 90 degrees | [n-2]: 270 degrees | 180 degrees |
| [n+3]: 135 degrees | [n-3]: 225 degrees | 90 degrees |
| [n+4]: 180 degrees | [n-4]: 180 degrees | 0 degrees |

*FIG. 5C*

PASSIVE MIXER

CROSS-REFERENCE TO RELATED APPLICATION

The present application claims the benefit of U.S. Provisional Patent Application No. 62/599,598, filed on Dec. 15, 2017, and titled "BAND TILT FREE PASSIVE MIXER UPCONVERTER," the disclosure of which is expressly incorporated by reference herein in its entirety.

BACKGROUND

Field

The present disclosure generally relates to mixers. More specifically, the present disclosure relates to a band tilt free passive mixer.

Background

A passive mixer is a popular element of a topology for complementary metal-oxide-semiconductor (CMOS) transmitters/receivers. Conventional passive mixers directly drive a following stage having a capacitive load (e.g., an input capacitance). Unfortunately, the capacitive load to the passive mixer results in undesirable band tilt when driving the following stage. For example, in a carrier aggregation system, signal components above a carrier frequency signal are referred to as upper sideband (USB) signals. By contrast, the signal components below the carrier frequency are referred to as lower sideband (LSB) signals. Band tilt occurs when, for example, capacitive load from a passive mixer causes an imbalance of an upper sideband signal relative to a lower sideband.

Band tilt causes many issues, such as low system efficiency and degraded error vector magnitude (EVM). Current solutions implement an inductor-capacitor (LC) tank for generating a real impedance load to the mixer. Unfortunately, this approach consumes substantial chip area, adds layout floorplan complexity, and also exhibits a low impedance load on the mixer, which consumes more current.

It is, therefore, desirable to improve an efficiency of a passive mixer as well as an error vector magnitude by removing the undesired band tilt.

SUMMARY

A passive mixer may include an output coupled to a next stage circuit. The output may be coupled to baseband inputs via first switches. The passive mixer may further include a capacitor bank. The capacitor bank may be coupled via second switches to the baseband inputs.

A method of operating a mixer may include storing a first voltage in a capacitor bank using a first switch coupled to a first baseband input during a first phase of operation. The method may further include storing a second voltage in an output of the mixer using a second switch coupled to a second baseband input during the first phase of operation. The method may further include disconnecting the capacitor bank from the first baseband input. The method may further include connecting the capacitor bank to the output of the mixer using a third switch, the third switch coupling a third baseband input to the output during a third phase of operation. The method may further include producing a voltage at the output using the third baseband input, the first stored voltage, and the second stored voltage during the third phase of operation.

A passive mixer may include means for outputting coupled to a next stage circuit. The outputting means may be coupled to baseband inputs via first switches. The passive mixer may further include means for storing capacitance. The capacitance storing means may be coupled via second switches to the baseband inputs.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5B and 5C are tables illustrating a phase difference between switches.

DETAILED DESCRIPTION

Figure 1:
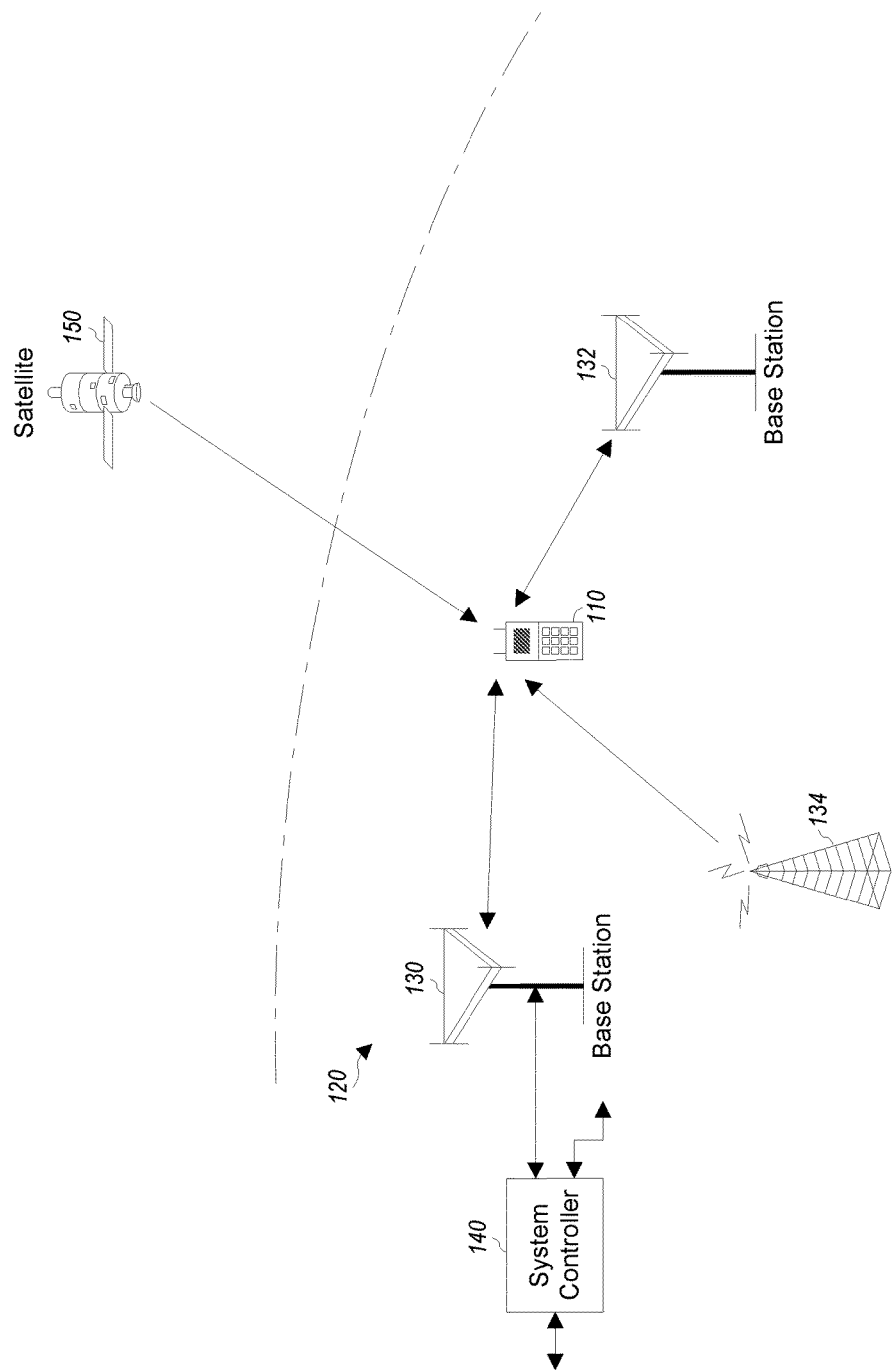
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chip designs (e.g., mobile RF transceivers) becomes complex at deep sub-micron process nodes due to cost and power consumption considerations. Further design challenges for mobile RF transceivers include analog/RF performance considerations, including mismatch, noise, and other performance considerations. Designing these mobile RF transceivers is further complicated by added circuit functions for supporting communication enhancements.

A wireless device (e.g., a cellular phone or a smartphone) in a wireless communication system may include a mobile RF transceiver for transmitting and receiving data for two-way communication. The mobile RF transceiver may include a transmit section for transmitting data and a receive section for receiving data. For transmitting data, the transmit section may modulate an RF carrier signal with data for obtaining a modulated RF signal, amplify the modulated RF signal for obtaining an amplified RF signal having the proper output power level, and transmit the amplified RF signal via an antenna to a base station. For receiving data, the receive section may obtain a received RF signal via the antenna and may amplify and process the received RF signal for recovering data sent by the base station.

The basic operation of the receiver in a mobile RF transceiver is as follows. For the receiver, a signal from the antenna may be amplified in an RF stage (e.g., low noise amplifier (LNA)). The output of the RF stage is provided to a first input of an RF mixer. A local oscillator (LO) signal is provided to a second input of the RF mixer. The RF mixer generates an intermediate frequency (IF) output signal. A second mixer stage may convert the IF output signal to a baseband signal. The baseband signal is then demodulated. The modulation technique is independent from the receiver technology.

The basic operation of a transmitter in a mobile RF transceiver is as follows. A local oscillator (LO) input signal is mixed with another input signal at a mixer to achieve frequency translation to upconvert a signal. For single stage upconversion, an input baseband signal is upconverted into an RF signal. The baseband signal is a complex valued signal that includes an in-phase (I) and a quadrature-phase (Q) signal.

Two mixers may be implemented for upconverting or downconverting the complex baseband signal. For example, one mixer is driven by an in-phase LO signal, and the other mixer is driven by a quadrature-phase LO signal. In the case of upconversion, the other ports of the two mixers are driven by an in-phase baseband signal and a quadrature-phase baseband signal, respectively. An output of the two mixers is summed to generate an RF signal for transmission.

Radio frequency (RF) transmitters generally include at least one mixer for frequency translating a baseband (BB) signal (or an intermediate frequency (IF) signal) to an RF signal by using a local oscillator (LO) signal. The mixer may be an active mixer or a passive mixer. A passive mixer is a popular topology for complementary metal-oxide-semiconductor (CMOS) transmitters/receivers. Conventional passive mixers directly drive a following stage, which has a capacitance (e.g., an input capacitance). Unfortunately, the input capacitance of the following stage may result in undesirable band tilt when driving the following stage.

For example, signal components above a carrier frequency are referred to as upper sideband (USB) signals. By contrast, the signal components below the carrier frequency are referred to as lower sideband (LSB) signals. Unfortunately, a carrier aggregation system is susceptible to band tilt when using a passive mixer. For example, band tilt may occur when an input capacitance of a driver amplifier (DA) connected to an output of the passive mixer causes an imbalance of an upper sideband signal relative to a lower sideband signal.

Band tilt causes many issues, such as low system efficiency and degraded error vector magnitude (EVM). Current solutions implement an inductor-capacitor (LC) tank for generating an impedance load to the mixer. Unfortunately, this approach consumes significant chip area and also induces a low impedance loading on the mixer, which consumes more current. It is, therefore, desirable to improve the efficiency of a passive mixer as well as the error vector magnitude by removing the undesired band tilt.

Aspects of the present disclosure include a passive mixer that overcomes the above-described deficiencies. According to aspects of the present disclosure, a passive mixer operates using a high impedance load for eliminating band tilt. In this aspect of the present disclosure, the passive mixer may include an output coupled to a next stage circuit. The output may be coupled to a set of baseband (BB) inputs via a first set of switches. A tunable capacitor bank may be coupled via a second set of switches to the set of BB inputs for canceling an input capacitance of the passive mixer for preventing band tilt of the USB signals relative to the LSB signals.

FIG. 1 shows a wireless device 110 communicating with a wireless communication system 120, which includes the disclosed passive mixer. The wireless communication system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a hand-held device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five (5) carriers in one or two bands in LTE Release 11.

Figure 2:
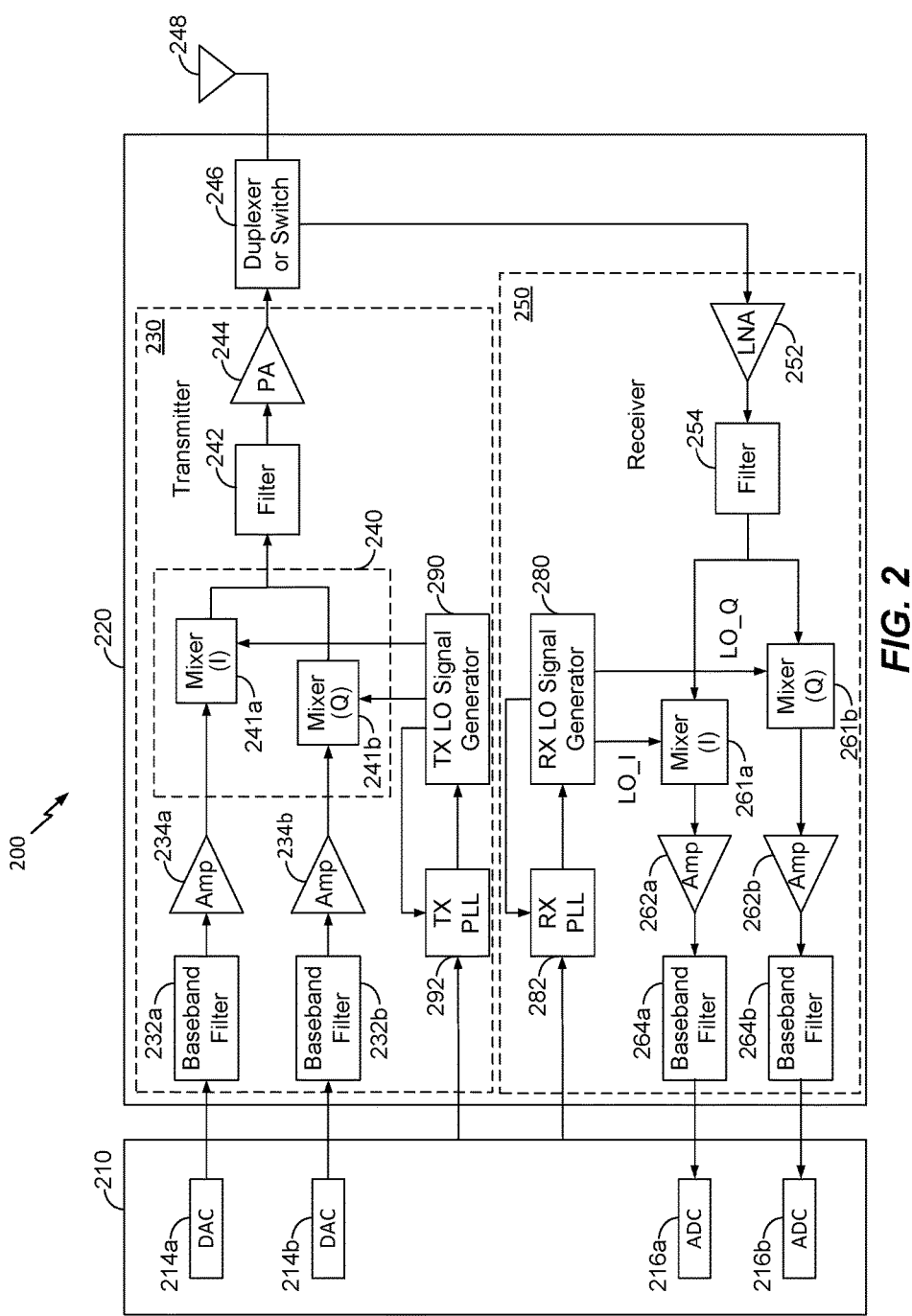
FIG. 2 shows a block diagram of the wireless device in FIG. 1.

FIG. 2 shows a block diagram of an exemplary design of a wireless device 200 that includes the disclosed passive mixer, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, baseband filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from baseband filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by baseband filters 264a and 264b for obtaining in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

The transmitter 230 includes the upconverter 240, having upconversion mixers 241a and 241b for upconverting the in-phase (I) and quadrature (Q) baseband signals with in-phase (I) and quadrature (Q) transmit (TX) local oscillator (LO) signals from the TX LO signal generator 290 to provide an upconverted signal. The upconversion mixers 241a and 241b may be active or passive mixers. Conventional passive mixers directly drive a following stage, for example a DA having an input capacitance, which results in a capacitive load. Unfortunately, the input capacitance of the following stage may result in undesirable band tilt when driving the following stage.

Figure 3:
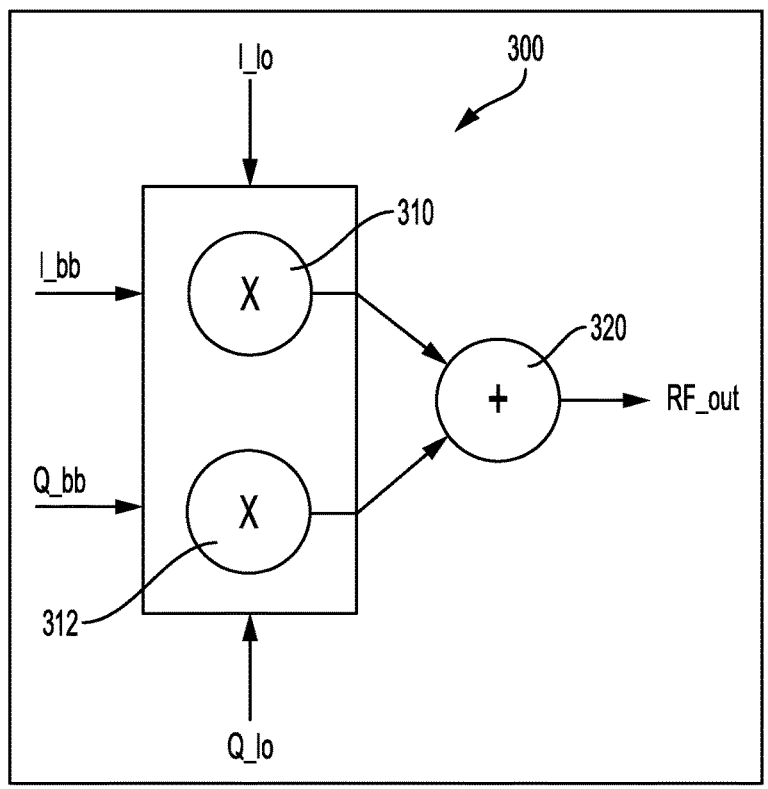
FIG. 3 shows a block diagram of a conventional mixer.

FIG. 3 illustrates a block diagram of a mixer 300. The mixer 300 combines a complex valued baseband (BB) signal with a complex valued local oscillator (LO) signal. For example, each of the BB signal and the LO signal includes in-phase (I) signals (e.g., I_lo and I_bb) and quadrature-phase (Q) signals (e.g., Q_lo and Q_bb).

In the case of upconversion, an input BB signal is upconverted to a radio frequency (RF) signal. To accomplish this, two sub-mixers are used. A first sub-mixer 310 is driven by I_lo and I_bb, and a second sub-mixer 312 is driven by Q_lo and Q_bb. The output of the two mixers is summed by a summer 320 to generate an RF signal RF_out.

Figure 4A:
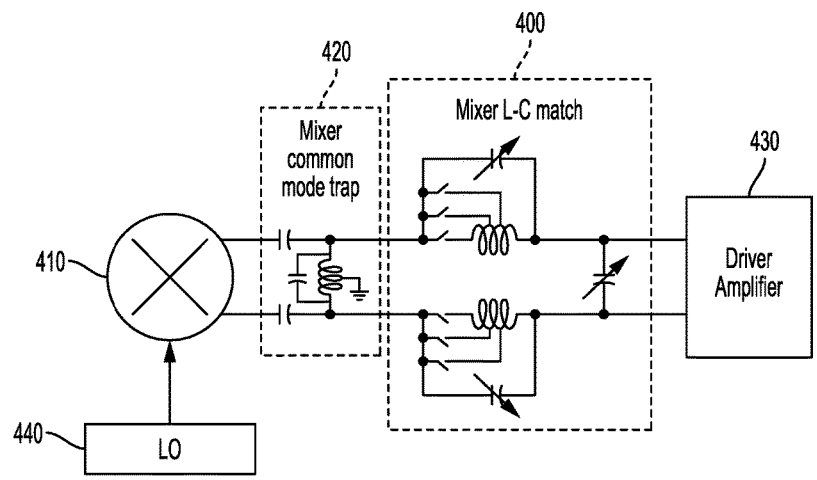
FIG. 4A is a schematic diagram of a conventional inductor-capacitor (LC) tank coupled to a conventional mixer.

FIG. 4A is a schematic diagram of a conventional inductor-capacitor (LC) tank 400 coupled to a mixer 410 (e.g., a passive mixer). The mixer 410 is coupled to the LC tank 400 through a mixer common mode trap circuit 420. The LC tank 400 is also coupled to a driver amplifier (DA) 430. A local oscillator (LO) 440 drives the mixer 410. In operation, the LC tank 400 generates a low impedance load to an output of the mixer 410.

Unfortunately, the LC tank 400 consumes a large area on a chip, especially for low band applications. Conventional solutions for overcoming this problem include removing the LC tank 400 and the mixer common mode trap circuit 420. In this configuration, an input capacitance of the DA 430 directly loads the output of the mixer 410 with a capacitive high impedance. For example, the impedance variation over a predetermined frequency (e.g., 20 MHz) is less than three percent (<3%) for a targeted frequency. Additionally, a lower sideband/upper sideband gain imbalance (e.g., 1~2 dB) results in an undesirable band tilt between the upper sideband and lower sideband signals.

Figure 4B:
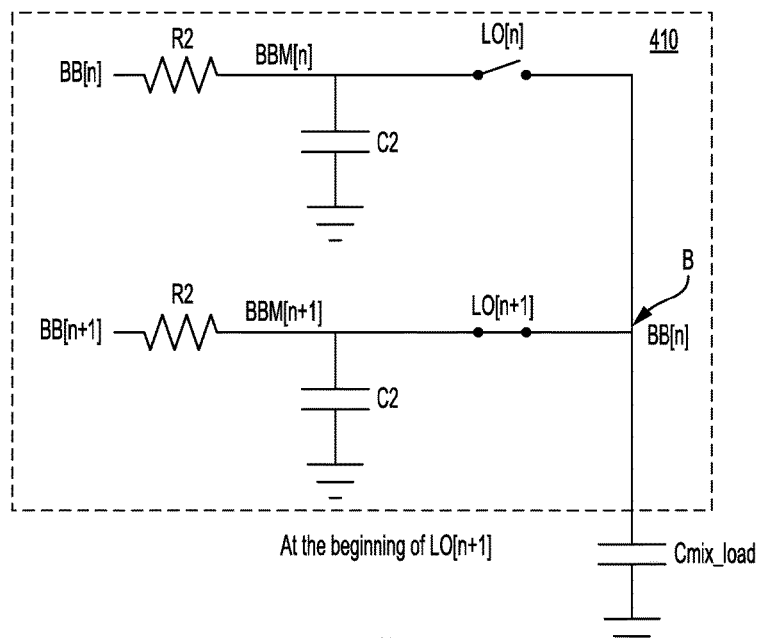
FIG. 4B is a schematic diagram of the conventional mixer of FIG. 4A.

FIG. 4B is a schematic diagram of the mixer 410 of FIG. 4A. The mixer 410 receives baseband signals BB[n] and BB[n+1], and includes resistors R2 coupled to capacitors C2, respectively. A first switch may be controlled by a signal LO[n] (e.g., zero degrees), and a second switch may be controlled by a signal LO[n+1] (e.g., 90 degrees). These signals are generated by the local oscillator (LO) 440. The mixer 410 further drives a capacitor Cmix_load, which represents an input capacitance of the next stage (e.g., a driver amplifier (DA)). For example, the capacitor Cmix_load may represent the DA 430, as shown in FIG. 4A.

In operation, the mixer 410 includes no isolation between its input and output nodes. As a result, the capacitor Cmix_load is configured for storing a voltage associated with a previous phase of a baseband signal. The previous phase of the baseband signal may include a phase of the baseband signal different from the phase of the baseband signal present at the output. In particular, it is one phase previous to the baseband signal that is present at the output, regardless of a number of phases. For example, a node B is configured for storing a voltage associated with the signal BB[n] while also receiving the signal BB[n+1]. As a result, a capacitive loading in the mixer 410 has different impacts on mixer gain. For example, an in-phase I signal leading a quadrature Q signal results in unwanted signal compression. By contrast, the quadrature Q signal leading the in-phase I sign results in unwanted signal expansion. This causes a gain delta between the lower sideband and the upper sideband signals, resulting in unwanted band tilt. The band tilt is also affected by values of the capacitor Cmix_load and the resistors R2. As a result, there is a desire for a passive mixer that overcomes these deficiencies.

As described above, a capacitive high impedance mixer load may be implemented in a low band transmit (TX) signal path. While having many benefits, this topology exhibits undesirable band tilt. The root cause of the band tilt is identified as lower sideband/upper sideband gain imbalance due to baseband phase interaction in passive mixers. Although this tilt could be mitigated with optimization, a novel topology is proposed for removing this band tilt. The novel topology implements a second set of switches and a dummy/auxiliary capacitor for canceling an input capacitance of the next stage after the mixer and preventing the band tilt.

Aspects of the present disclosure describe a passive mixer that operates using a high impedance load for reducing band tilt. The passive mixer may include an output coupled to a next stage circuit (e.g., a driver amplifier (DA)). The output may be coupled to a set of baseband (BB) inputs via a first set of switches. For example, the set of baseband inputs may include different phases of a baseband signal. A tunable capacitor bank may be coupled via a second set of switches to the set of baseband inputs for canceling an input capacitance of the next stage for preventing band tilt.

Figure 5A:
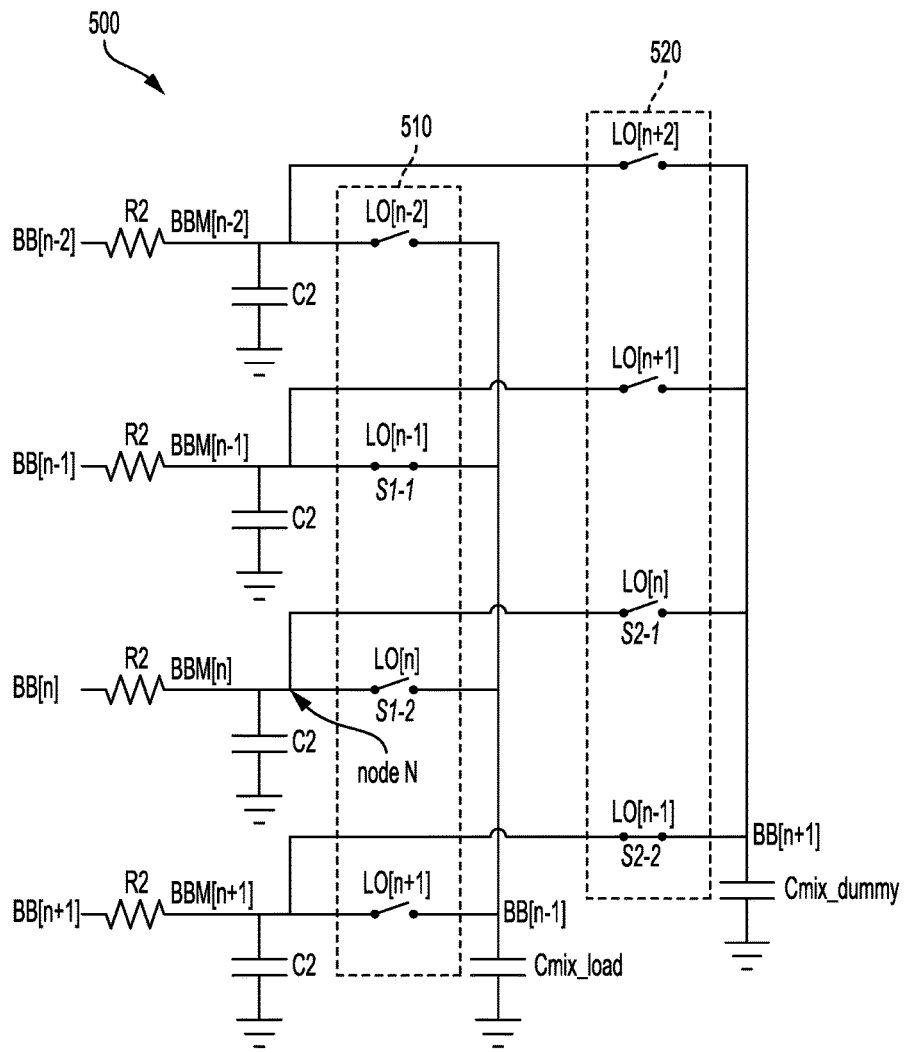
FIG. 5A is a diagram of a band tilt free passive mixer, according to aspects of the present disclosure.

FIG. 5A is a diagram of a passive mixer, according to aspects of the present disclosure. A passive mixer 500 may include multiple resistors R2 coupled to multiple capacitors C2, respectively. The passive mixer 500 may further include multiple first switches 510 and multiple second switches 520.

According to aspects of the present disclosure, the passive mixer 500 may be configured for receiving baseband (BB) signals having adjacent phases (e.g., BB[n−2], BB[n−1], etc.). For example, in the four phase implementation as illustrated in FIG. 5A, [n−2] may designate a phase of 180 degrees, [n−1] may designate a phase of 270 degrees, [n] may designate a phase of zero degrees, and [n+1] may designate a phase of 90 degrees, where 90 degrees is adjacent to zero degrees and 180 degrees, etc. These baseband inputs may be sinusoidal. According to an aspect of the present disclosure, four phases, six phases, eight phases, twelve phases, or any other number of phases, may be implemented. For example, for eight phases, the phases may include zero degrees, 45 degrees, 90 degrees, 135 degrees, 180 degrees, 225 degrees, 270 degrees, and 315 degrees.

The passive mixer 500 is further configured for receiving local oscillator (LO) signals having adjacent phases (e.g., LO[n−2], LO[n−1], etc.). For example, 315 degrees and 45 degrees are adjacent phases to zero degrees, in an eight phase embodiment. Viewing the passive mixer 500 from top to bottom, each of the first set of switches 510 may be controlled by signals LO[n−2], LO[n−1], etc., respectively. In addition, viewing the passive mixer 500 from top to bottom, each of the second set of switches 520 may be controlled by signals LO[n+2], LO[n+1], etc., respectively.

Although four inputs representing four phases are illustrated, it is understood that the passive mixer 500 may be configured to receive eight phases as well. For example, in an eight-phase embodiment, four additional resistors, capacitors, first switches, and second switches may be added to the passive mixer 500. The eight-phase embodiment may substantially look like two four-phase embodiments coupled together from top to bottom. Other numbers of phases are also contemplated.

In operation, a charge stored by an auxiliary capacitor (e.g., represented as Cmix_dummy) cancels a capacitance of a load of a driver amplifier because it is approximately equal to, but of opposite polarity (e.g., represented as Cmix_load). According to aspects of the present disclosure, the capacitor Cmix_dummy may be a tunable capacitor bank.

At time [n−1], switches S1-1 (e.g., a first switch of the first set of switches 510) and S2-2 (e.g., a second switch of the second set of switches 520), which are controlled by signal LO[n−1] (e.g., a first control line), are closed and all other switches are open. As a result, the DA input capacitance Cmix_load stores a voltage associated with a first baseband signal (e.g., Cmix_load=BB[n−1]) and the auxiliary capacitor Cmix_dummy stores a voltage associated with a second baseband signal (e.g., Cmix_dummy=BB[n+1]). Thus, the output (e.g., the DA capacitor Cmix_load) of the passive mixer 500 is configured for storing a voltage associated with a first phase of the baseband signal (e.g., BB[n−1]). In addition, the auxiliary capacitor Cmix_dummy is configured for storing a voltage associated with a second phase of the baseband signal (e.g., BB[n+1]).

At time [n], switches S1-2 (e.g., a second switch of the first set of switches 510) and S2-1 (e.g., a first switch of the second set of switches 520), which are controlled by signal LO[n] (e.g., a second control line), are closed and all other switches are open. As a result, the voltage previously stored by Cmix_load (due to the previous phase of the baseband signal (e.g., BB[n−1])) and the voltage previously stored by Cmix_dummy (due to the next phase of the baseband signal (e.g., BB[n+1])) are both present at the output of the mixer. These two voltages are approximately equal in magnitude but opposite in sign. Consequently, they cancel each other out so the aggregate voltage at the output is the voltage of the current phase of the baseband signal (e.g., BB[n]).

According to an aspect of the present disclosure, switch S1-1 and switch S2-2 are configured to selectively conduct different baseband phases. Additionally, switch S1-2 and switch S2-1 are configured to selectively conduct a same baseband phase. Selectively conducting means that the switches conduct when closed.

According to aspect of the present disclosure, a third switch of the first set of switches 510 and a third switch of the second set of switches 520 are both coupled to a third control line that conducts a same baseband phase. According to an aspect of the present disclosure, a fourth switch of the first set of switches 510 and a fourth switch of the second set of switches 520 are both coupled to a fourth control line that conducts different baseband phases, which are non-adjacent.

The fourth switch of the first set of switches 510 conducts a different phase than switch S1-1. The fourth switch of the second set of switches 520 conducts a different phase than switch S2-2.

According to aspects of the present disclosure, auxiliary capacitor Cmix_dummy is a dummy capacitor that models an input capacitance of the next stage for the purposes of canceling the charge of the DA capacitor Cmix_load. The auxiliary capacitor Cmix_dummy can be a tunable capacitor bank. For example, the tunable capacitor bank may be tuned to be approximately the same as the input capacitance of the devices connected to the output of the mixer (e.g., the input capacitance of the DA 430). For example, this may be tuned and measured during a chip validation phase. In this way, effects of the input capacitance of the next stage connected to the passive mixer 500 is mitigated. Removing the input capacitance beneficially prevents band tilt between lower sideband signals and upper sideband signals.

According to aspects of the present disclosure, the DA capacitor Cmix_load may be coupled to a next stage circuit. A tunable capacitor bank may be configured for providing a selectable amount of capacitance such that a selected amount of capacitance matches a capacitance of a mixer load corresponding to a next stage circuit input capacitance and a mixer parasitic capacitance. For example, the next stage circuit may include a driver amplifier or an intermediate inductor-capacitor (LC) filter bank.

According to aspects of the present disclosure, the tunable capacitor bank (e.g., Cmix_dummy) may be configured for storing a voltage associated with a previous phase of the baseband signal. Additionally, the output (e.g., Cmix_load) may be configured for storing a voltage associated with a previous phase of the baseband signal.

FIG. 5B is a table illustrating a phase difference of the first set of switches 510 and the second set of switches 520 for a four phase embodiment. For example, a switch of the first set of switches 510 that is controlled by LO[n−2] may conduct a baseband phase of 180 degrees. A switch of the second set of switches 520 that is controlled by LO[n+2] (e.g., a third switch of the second set of switches) may also conduct the same baseband phase of 180 degrees.

As another example, another switch of the first set of switches 510 that is controlled by LO[n−1] may conduct a baseband phase of 270 degrees. Another switch of the second set of switches 520 that is controlled by LO[n+1] may conduct a different baseband phase of 90 degrees. The difference between the phases is 180 degrees (e.g., at least two phases apart and non-adjacent).

FIG. 5C is a table illustrating a phase difference of a first set of switches 610 and a second set of switches 620 in an eight phase implementation. For example, a switch of the first set of switches 610 that is controlled by LO[n−3] may conduct a baseband phase of 225 degrees. A switch of the second set of switches 620 that is controlled by LO[n+3] may conduct a different baseband phase of 135 degrees. The difference between the phases is 90 degrees.

As illustrated in FIGS. 5B and 5C, the two phases conducted by the first and second sets of switches at any particular moment in time may be the same, or non-adjacent (e.g., at least two phases apart). For example, the two phases may be the same (e.g., difference of phases is 0 degrees), or non-adjacent (e.g., difference of phases is 180 degrees or more when there are four phases).

More generally, to determine "non-adjacent" phases, 360 degrees is divided by a total number of phases to determine a number of degrees between phases. For example, for four phases, the number of degrees between phases is 360 divided by four, which equals 90 degrees. "Non-adjacent" means the phases are at least twice the number of degrees between phases away from each other. For example, when the number of degrees between phases is 90 degrees, non-adjacent means the phases are at least 180 degrees (e.g., twice 90 degrees) away from each other.

Figure 6:
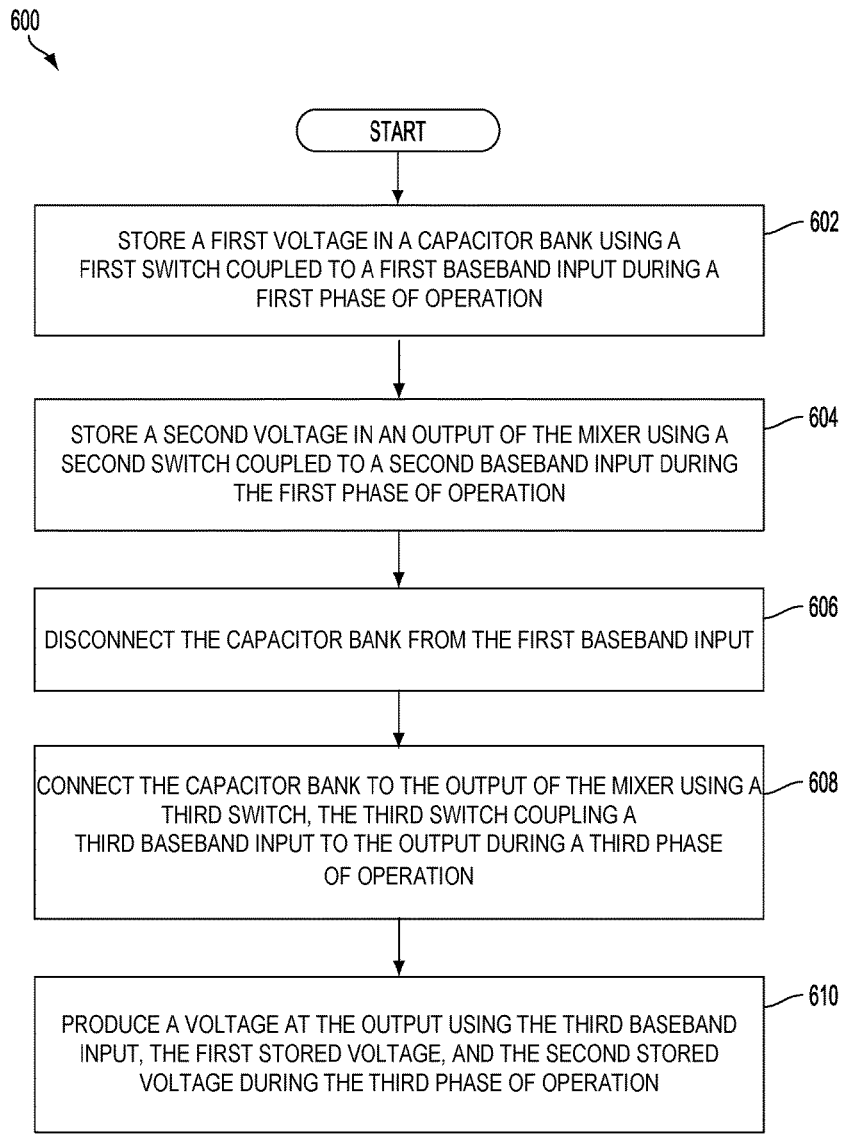
FIG. 6 depicts a simplified flowchart of a method for operating a passive mixer, according to aspects of the present disclosure.

FIG. 6 depicts a simplified flowchart 600 of a method of operating a passive mixer, according to aspects of the present disclosure. At block 602, a first voltage is stored in a capacitor bank using a first switch coupled to a first baseband input during a first phase of operation. For example, switch S2-2 couples the auxiliary capacitor Cmix_dummy to BB[n+1] through a control line LO[n−1], as shown in FIG. 5A.

At block 604, a second voltage is stored in an output of the mixer using a second switch coupled to a second baseband input during the first phase of operation. For example, the switch S1-1 couples the DA capacitor Cmix_load to BB[n−1] through control line LO[n−1], as shown in FIG. 5A.

At block 606, the capacitor bank is disconnected from the first baseband input. For example, the auxiliary capacitor Cmix_dummy is disconnected from BB[n+1] when switch S2-2 opens, as shown in FIG. 5A.

According to aspects of the present disclosure, the method may further include disconnecting the output from the second baseband input during a second phase of operation. For example, the DA capacitor Cmix_load is disconnected from BB[n−1] when the switch S1-1 opens, as shown in FIG. 5A.

At block 608, the capacitor bank is connected to the output of the mixer using a third switch, the third switch coupling a third baseband input to the output during a third phase of operation. For example, the switch S1-2 couples BB[n] to Cmix_load, as shown in FIG. 5A.

At block 610, a voltage is produced at the output using the third baseband input, the first stored voltage, and the second stored voltage during the third phase of operation. For example, BB[n+1] and BB[n−1] cancel each other out at node N, such that the output is just BB[n], as shown in FIG. 5. In this way, a leading phase of the baseband signal is configured to cancel a lagging phase of the baseband signal.

According to one aspect of the present disclosure, a passive mixer is described. The passive mixer includes means for outputting. The outputting means may be, for example, the output load Cmix_load as shown in FIG. 5A. The passive mixer may further include means for storing capacitance. The capacitance storing means also provides a selectable amount of capacitance, such that a selected amount of the selectable capacitance matches a capacitance of a mixer load corresponding to a next stage circuit input capacitance and a mixer parasitic capacitance. The capacitance storing means may be, for example, the capacitor bank Cmix_dummy as shown in FIG. 5A. In another aspect, the aforementioned means may be any module or any apparatus or material configured to perform the functions recited by the aforementioned means.

Figure 7:
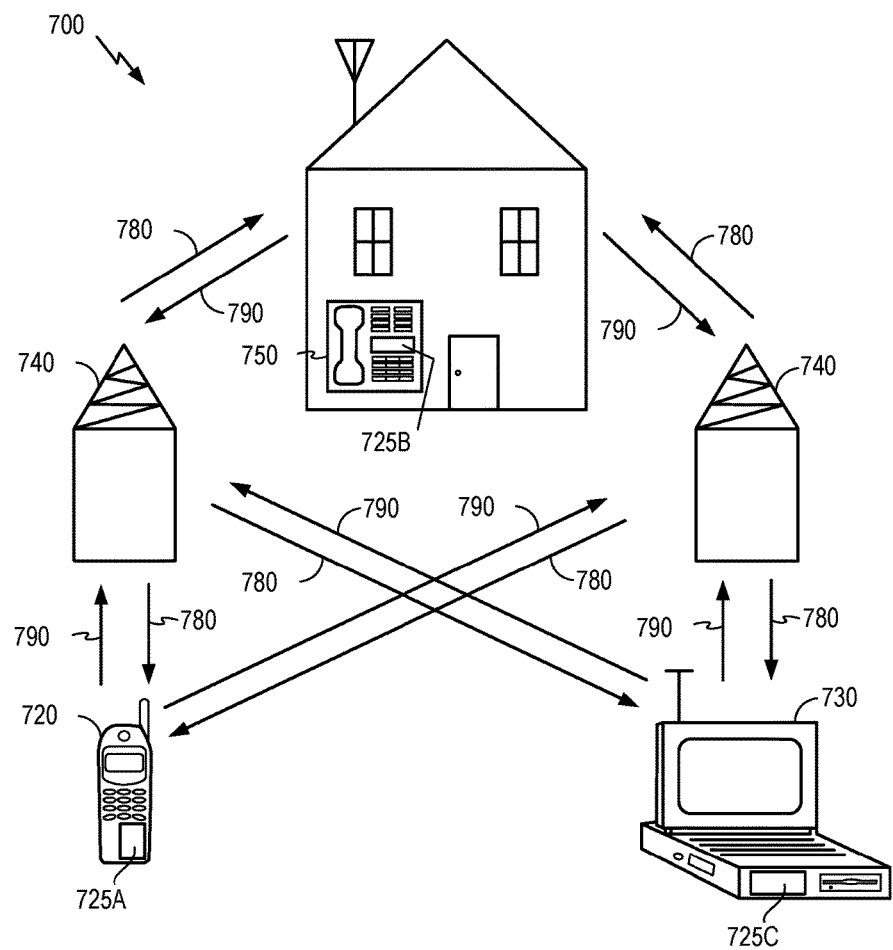
FIG. 7 is a block diagram showing an exemplary wireless communication system in which a configuration of the disclosure may be advantageously employed.

FIG. 7 is a block diagram showing an exemplary wireless communication system in which a configuration of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725B, and 725C that include the disclosed passive mixer. It will be recognized that other devices may also include the disclosed passive mixer, such as the base stations, switching devices, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 7 illustrates remote units according to the aspects of the present disclosure, the disclosure is not limited to these exemplary illustrated units. Aspects of the present disclosure may be suitably employed in many devices, which include the passive mixer.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A passive mixer, comprising:
    an output coupled to a next stage circuit, the output coupled to a plurality of baseband inputs via a first plurality of switches; and
    a capacitor bank coupled via a second plurality of switches to the plurality of baseband inputs, the capacitor bank being coupled to the output via the first plurality of switches and the second plurality of switches.

2. The passive mixer of claim 1, in which the capacitor bank comprises a tunable capacitor bank.

3. The passive mixer of claim 1, in which the plurality of baseband inputs comprise different phases of a baseband signal.

4. The passive mixer of claim 3, in which the capacitor bank is configured to store a voltage associated with a previous phase of the baseband signal, the previous phase being a phase of the baseband signal different from the phase of the baseband signal present at the output.

5. The passive mixer of claim 3, in which an input capacitance of the next stage circuit is configured to store a voltage associated with a previous phase of the baseband signal.

6. The passive mixer of claim 3, in which a first switch of the first plurality of switches is coupled to a first control line and a first switch of the second plurality of switches is coupled to a second control line, a second switch of the first plurality of switches is coupled to the second control line, and a second switch of the second plurality of switches is coupled to the first control line.

7. The passive mixer of claim 6, in which the first switch of the first plurality of switches and the second switch of the second plurality of switches are configured to selectively conduct different baseband phases.

8. The passive mixer of claim 7, in which the different baseband phases are non-adjacent.

9. The passive mixer of claim 6, in which the second switch of the first plurality of switches and the first switch of the second plurality of switches are configured to selectively conduct a first same baseband phase.

10. The passive mixer of claim 9, in which a third switch of the first plurality of switches and a third switch of the second plurality of switches are both coupled to a third control line, the third switch of the first plurality of switches and the third switch of the second plurality of switches being configured to conduct a second same baseband phase that is different from the first same baseband phase.

11. The passive mixer of claim 10, in which a fourth switch of the first plurality of switches and a fourth switch of the second plurality of switches are both coupled to a fourth control line, the fourth switch of the first plurality of switches and the fourth switch of the second plurality of switched being configured to conduct different baseband phases that are non-adjacent, the fourth switch of the first plurality of switches conducting a different phase than a first switch of the first plurality of switches, and the fourth switch of the second plurality of switches conducting a different phase than a second switch of the second plurality of switches.

12. The passive mixer of claim 1, in which the capacitor bank is tunable and configured to provide a selectable capacitance such that a selected amount of the selectable amount of capacitance is configured to match an input capacitance of the next stage circuit and a mixer parasitic capacitance.

13. The passive mixer of claim 1, in which the next stage circuit comprises a driver amplifier.

14. A method of operating a mixer comprising:
    storing a first voltage in a capacitor bank using a first switch coupled to a first baseband input during a first phase of operation, the capacitor bank being coupled between an output of the mixer and a ground node;
    storing a second voltage in an output of the mixer using a second switch coupled to a second baseband input during the first phase of operation;
    disconnecting the capacitor bank from the first baseband input;
    connecting the capacitor bank to the output of the mixer using a third switch, the third switch coupling a third baseband input to the output during a third phase of operation; and
    producing a voltage at the output using the third baseband input, the first stored voltage, and the second stored voltage during the third phase of operation.

15. The method of claim 14, further comprising disconnecting the output from the second baseband input during a second phase of operation.

16. The method of claim 14, in which the storing the first voltage comprises coupling a first switch of a first plurality of switches to a first control line.

17. The method of claim 16, in which the storing the second voltage comprises coupling a first switch of a second plurality of switches to a second control line.

18. The method of claim 17, in which the connecting comprises:
    coupling a second switch of the first plurality of switches to the second control line; and coupling a second switch of the second plurality of switches to the first control line.

19. The method of claim 14, in which a leading phase of a baseband signal is configured to cancel a lagging phase of the baseband signal.

20. A passive mixer, comprising:

means for outputting coupled to a next stage circuit, the outputting means coupled to a plurality of baseband inputs via a first plurality of switches; and means for storing charge coupled via a second plurality of switches to the plurality of baseband inputs and coupled between an output of the passive mixer and a ground node.

21. The mixer of claim 20, in which a first switch of the first plurality of switches is coupled to a first control line and a first switch of the second plurality of switches is coupled to a second control line, a second switch of the first plurality of switches is coupled to the second control line, and a second switch of the second plurality of switches is coupled to the first control line, in which a leading phase of the baseband signal is configured to cancel a lagging phase of the baseband signal.

* * * * *